United States Patent
Onishi

(10) Patent No.: US 8,913,690 B2
(45) Date of Patent: Dec. 16, 2014

(54) AMPLIFIER CIRCUIT AND WIRELESS COMMUNICATION EQUIPMENT

(75) Inventor: Masahiko Onishi, Osaka (JP)

(73) Assignee: Sumitomo Electric Industries, Ltd., Osaka-shi, Osaka (JP)

( * ) Notice: Subject to any disclaimer, the term of this patent is extended or adjusted under 35 U.S.C. 154(b) by 0 days.

(21) Appl. No.: 14/114,537

(22) PCT Filed: Feb. 6, 2012

(86) PCT No.: PCT/JP2012/052589
§ 371 (c)(1),
(2), (4) Date: Oct. 29, 2013

(87) PCT Pub. No.: WO2012/157296
PCT Pub. Date: Nov. 22, 2012

(65) Prior Publication Data
US 2014/0064406 A1    Mar. 6, 2014

(30) Foreign Application Priority Data

May 13, 2011 (JP) .................. 2011-108353

(51) Int. Cl.
| | | |
|---|---|---|
| H04L 25/10 | (2006.01) | |
| H03F 1/32 | (2006.01) | |
| H04L 27/36 | (2006.01) | |
| H03F 3/24 | (2006.01) | |
| H04B 1/04 | (2006.01) | |

(52) U.S. Cl.
CPC .............. *H04L 25/10* (2013.01); *H03F 1/3247* (2013.01); *H03F 1/3294* (2013.01); *H04B 2001/0433* (2013.01); *H04L 27/361* (2013.01); *H04L 27/364* (2013.01); *H03F 3/245* (2013.01); *H04L 27/368* (2013.01)
USPC ........................................................ 375/296

(58) Field of Classification Search
CPC ..................... H04L 27/367; H04B 2001/0425; H04B 2001/0433; H03F 1/3241; H03F 1/3247; H03F 1/3294; H03F 2201/3233
USPC ................................................. 375/296, 297
See application file for complete search history.

(56) References Cited

U.S. PATENT DOCUMENTS

| | | | | |
|---|---|---|---|---|
| 6,313,703 | B1* | 11/2001 | Wright et al. ............. | 330/149 |
| 7,848,452 | B2 | 12/2010 | Hayashi et al. | |
| 7,957,480 | B2 | 6/2011 | Egashira et al. | |
| 2005/0047521 | A1* | 3/2005 | Ishikawa et al. ........... | 375/296 |
| 2007/0286307 | A1* | 12/2007 | Hayashi et al. ............ | 375/297 |
| 2012/0039415 | A1* | 2/2012 | Matsubara et al. ......... | 375/296 |
| 2013/0259154 | A1* | 10/2013 | Ishikawa et al. ........... | 375/296 |

FOREIGN PATENT DOCUMENTS

| | | |
|---|---|---|
| EP | 1 489 803 A1 | 12/2004 |
| JP | H11-136302 A | 5/1999 |

(Continued)

OTHER PUBLICATIONS

Young-Doo Kim, et al., "Joint Adaptive Compensation for Amplifier Nonlinearity and Quadrature Modulation Errors," IEEE, 2006, pp. 2290-2293.

*Primary Examiner* — Kevin Kim
(74) *Attorney, Agent, or Firm* — Drinker Biddle & Reath LLP

(57) ABSTRACT

A quadrature modulation error is compensated without providing an additional feedback loop for detecting quadrature modulation error. An amplifier circuit includes: a quadrature modulator; an amplifier that amplifies a quadrature-modulated signal; a distortion compensation section that compensates distortion to be caused in the amplifier based on first compensation coefficients; a quadrature modulation error compensation section that compensates for a quadrature modulation error; an updating section that updates second compensation coefficients for compensating the quadrature modulation error; an error estimation section that estimates an error of the quadrature modulation error; and a prediction section that calculates a prediction value of an output of the amplifier after updating of the second compensation coefficients. The second compensation coefficients are updated based on the estimated error. The prediction value is calculated based on the estimated error and the amplifier output. The distortion compensation section calculates the first compensation coefficient, based on the prediction value.

6 Claims, 10 Drawing Sheets

(56) References Cited

FOREIGN PATENT DOCUMENTS

| | | |
|---|---|---|
| JP | 2002-077285 A | 3/2002 |
| JP | 2007-053552 A | 3/2007 |
| JP | 2009-194432 A | 8/2009 |
| JP | 2009-213011 A | 9/2009 |
| JP | 4421635 B2 | 2/2010 |
| JP | 4499107 B2 | 7/2010 |
| WO | WO-2006/030481 A1 | 3/2006 |

* cited by examiner

AMPLIFIER CIRCUIT AND WIRELESS COMMUNICATION EQUIPMENT

TECHNICAL FIELD

The present invention relates to an amplifier circuit and wireless communication equipment.

BACKGROUND ART

When amplifying power by using an amplifier such as a high power amplifier (hereinafter referred to as "HPA") or the like, desired input-output characteristics may not be obtained due to nonlinear distortion characteristics of the amplifier.

Particularly when the frequency of a radio signal to be amplified is high, in order to linearize the amplifier by correcting the nonlinear characteristics thereof, a complex IQ baseband signal of a low frequency, before being converted to the radio signal, needs to be subjected to predistortion as described in Patent Literature 1.

A distortion compensation processing section generates a predistorted signal for canceling the nonlinear distortion of the amplifier by using digital signal processing.

The signal outputted from the distortion compensation processing section is quadrature-modulated by a quadrature modulator, and thereafter, amplified by an HPA.

If a modulation error occurs in the quadrature modulator, a distortion due to the modulation error occurs in the signal for canceling the nonlinear distortion of the HPA. Therefore, the signal for canceling the nonlinear distortion of the HPA does not arrive at the HPA as expected, and the compensation characteristics for the nonlinear distortion of the HPA are deteriorated.

Patent Literature 2 discloses an example of a technique for compensating such a quadrature modulation error.

CITATION LIST

Patent Literature

Patent Literature 1: Japanese Laid-Open Patent Publication No. 2009-194432
Patent Literature 2: Japanese Laid-Open Patent Publication No. 2002-77285

SUMMARY OF THE INVENTION

Problems to be Solved by the Invention

Patent Literature 2 discloses a technique for automatically compensating a quadrature modulation error. The technique disclosed in Patent Literature 2 needs an additional feedback loop for detecting a quadrature modulation error, which makes the hardware complicated, and incurs high cost.

Therefore, it is an object of the present invention to realize compensation of a quadrature modulation error without providing an additional feedback loop for detecting the quadrature modulation error.

Solution to the Problems (1) The present invention is an amplifier circuit including: a quadrature modulator that quadrature-modulates an IQ baseband signal; an amplifier that amplifies the quadrature-modulated signal; a distortion compensation section that compensates for distortion to be caused in the amplifier based on first compensation coefficients; a quadrature modulation error compensation section that compensates the IQ baseband signal outputted from the distortion compensation section for a quadrature modulation error; an updating section that updates second compensation coefficients that are used for compensation in the quadrature modulation error compensation section; an error estimation section that estimates an error in the IQ baseband signal, which error is caused by that the IQ baseband signal outputted from the quadrature modulation error compensation section is quadrature-modulated by the quadrature modulator; and a prediction section that calculates a prediction value of an output of the amplifier after updating of the second compensation coefficients. The updating section updates the second compensation coefficients, based on the error estimated by the estimation section. The error estimation section estimates the error, based on the IQ baseband signal before compensated by the distortion compensation section, and the IQ baseband signal obtained by quadrature demodulation of the output of the amplifier. The prediction section calculates the prediction value, based on the error estimated by the estimation section, and the IQ baseband signal obtained by quadrature demodulation of the output of the amplifier before updating of the second compensation coefficients based on the error estimated by the estimation section. The distortion compensation section calculates the first compensation coefficient, based on the prediction value.

(2) The error estimation section may estimate the error which is caused by that the IQ baseband signal outputted from the quadrature modulation error compensation section is DA-converted and quadrature-modulated by the quadrature modulator.

(3) The error estimated by the error estimation section may include: a DC offset and/or a carrier wave leakage which occur in a path from a DA converter that performs DA conversion of the IQ baseband signal outputted from the quadrature modulation error compensation section, to the quadrature modulator; and an IQ gain imbalance and/or a quadrature deviation which occur in the path from the DA converter that performs DA conversion of the IQ baseband signal outputted from the quadrature modulation error compensation section, to the quadrature modulator.

(4) Another aspect of the present invention is wireless communication equipment including the amplifier circuit according to any of above (1) to (3).

(5) Another aspect of the present invention is a method for compensating a signal by using an amplifier circuit including: a quadrature modulator that quadrature-modulates an IQ baseband signal; an amplifier that amplifies the quadrature-modulated signal; a distortion compensation section that compensates for distortion to be caused in the amplifier based on first compensation coefficients; and a quadrature modulation error compensation section that compensates the IQ baseband signal outputted from the distortion compensation section for a quadrature modulation error.

The method includes the steps of: estimating an error in the IQ baseband signal, which error is caused by that the IQ baseband signal outputted from the quadrature modulation error compensation section is quadrature-modulated by the quadrature modulator, based on the IQ baseband signal before compensated by the distortion compensation section, and the IQ baseband signal obtained by quadrature demodulation of the output of the amplifier; updating, based on the error estimated in the step of estimating, second compensation coefficients that are used in the quadrature modulation error compensation section; calculating a prediction value of the output of the amplifier after updating of the second compensation coefficients, based on the error estimated in the step of estimating, and the IQ baseband signal obtained by quadrature demodulation of the output of the amplifier before updating of the second compensation coefficients based on the error estimated in the step of estimating; and calculating the first compensation coefficients based on the prediction value.

(6) In above (5), preferably, the calculated new first compensation coefficients and the updated new second compensation coefficients start to be used by the distortion compensation section and the quadrature modulation error compensation section, respectively, at approximately the same time.

DESCRIPTION OF EMBODIMENTS

Hereinafter, a preferred embodiment of the present invention will be described with reference to the drawings.

[1. Overall Configuration of Amplifier Circuit]

Figure 1:
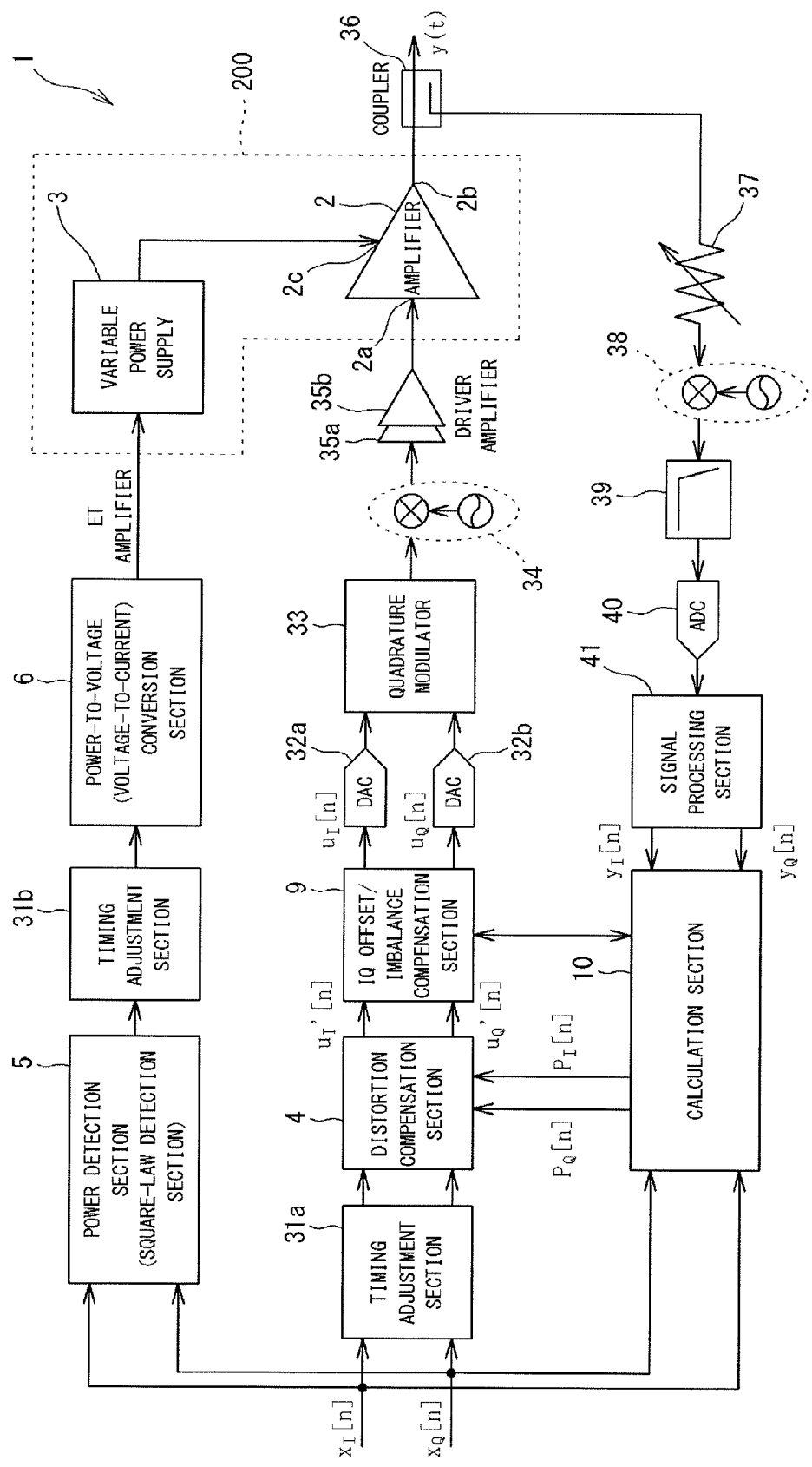
FIG. 1 is a block diagram showing an amplifier circuit according to an embodiment.

FIG. 1 shows an amplifier circuit 1 according to an embodiment. The amplifier circuit 1 is included in wireless communication equipment such as wireless base station equipment, and is used for amplification of a transmission signal. The amplifier circuit 1 may be used for amplification of a received signal.

The amplifier circuit 1 shown in FIG. 1 includes a high-power amplifier (HPA) 2, a variable power supply 3, a distortion compensation section 4, an IQ offset/imbalance compensation section 9, a quadrature modulator 33, and a calculation section 10.

The amplifier 2 serves to amplify an input signal, and includes a signal input port 2a to which a signal is input, and a signal output port 2b from which the signal is output. The amplifier 2 further includes a power supply port 2c to which a power supply voltage (drain voltage) V[n] is supplied.

The amplifier circuit 1 of the present embodiment adopts an envelope tracking method. Therefore, the variable power supply 3 varies a power supply voltage V[n] supplied to the power supply port 2c of the amplifier 2, in accordance with an envelope signal of a signal $x[n]$ ($=x_I[n]+i \times x_Q[n]$). That is, the amplifier 2 and the variable power supply 3 constitute an amplifier 200 that performs an envelope tracking operation (hereinafter referred to as an ET amplifier). Since the power supply voltage supplied to the amplifier 2 is varied in accordance with the envelope of the signal x[n], high-efficiency operation of the amplifier 2 is realized. The amplifier circuit 1 need not necessarily adopt the envelope tracking method.

Here, *[n] indicates a digital complex baseband IQ signal that is sampled at time n×T where the sampling interval is T (sec). In addition, *(t) indicates an analog signal at time t.

The variable power supply 3 is not limited to one that varies the power supply voltage (drain voltage) V[n], but may be one that varies a power supply current (drain current). Hereinafter, the variable power supply 3 will be described as one that varies the power supply voltage. However, even when "power supply voltage" is replaced with "power supply current" in the following description, functional equivalence is maintained.

In order to supply the envelope signal of the signal x[n] to the variable power supply 3, the amplifier circuit 1 includes a power detection section 5 for the signal x[n], and a power-to-voltage conversion section 6.

The power detection section 5 detects and outputs a power value (envelope signal) of the signal x[n] (IQ baseband signals $x_I[n]$ and $x_Q[n]$). The power-to-voltage conversion section 6 has a function of converting the power detected by the power detection section 5 to a power supply voltage value to be supplied to the amplifier 2. The power-to-voltage conversion section 6 outputs the converted power supply voltage value (envelope voltage value) to the variable power supply 3. The variable power supply 3 dynamically varies the voltage V[n] to be supplied to the power supply port 2c of the amplifier 2, in accordance with the converted power supply voltage value (envelope voltage value).

Timing adjustment sections 31a and 31b are provided at the stages preceding the distortion compensation section 4 and the power-to-voltage conversion section 6, respectively. The timing adjustment sections 31a and 31b perform timing adjustment so that the input ($x_I[n]$ and $x_Q[n]$) of the amplifier circuit, after traveling through the different paths, arrives at the output of the amplifier at the same time.

Figure 2:
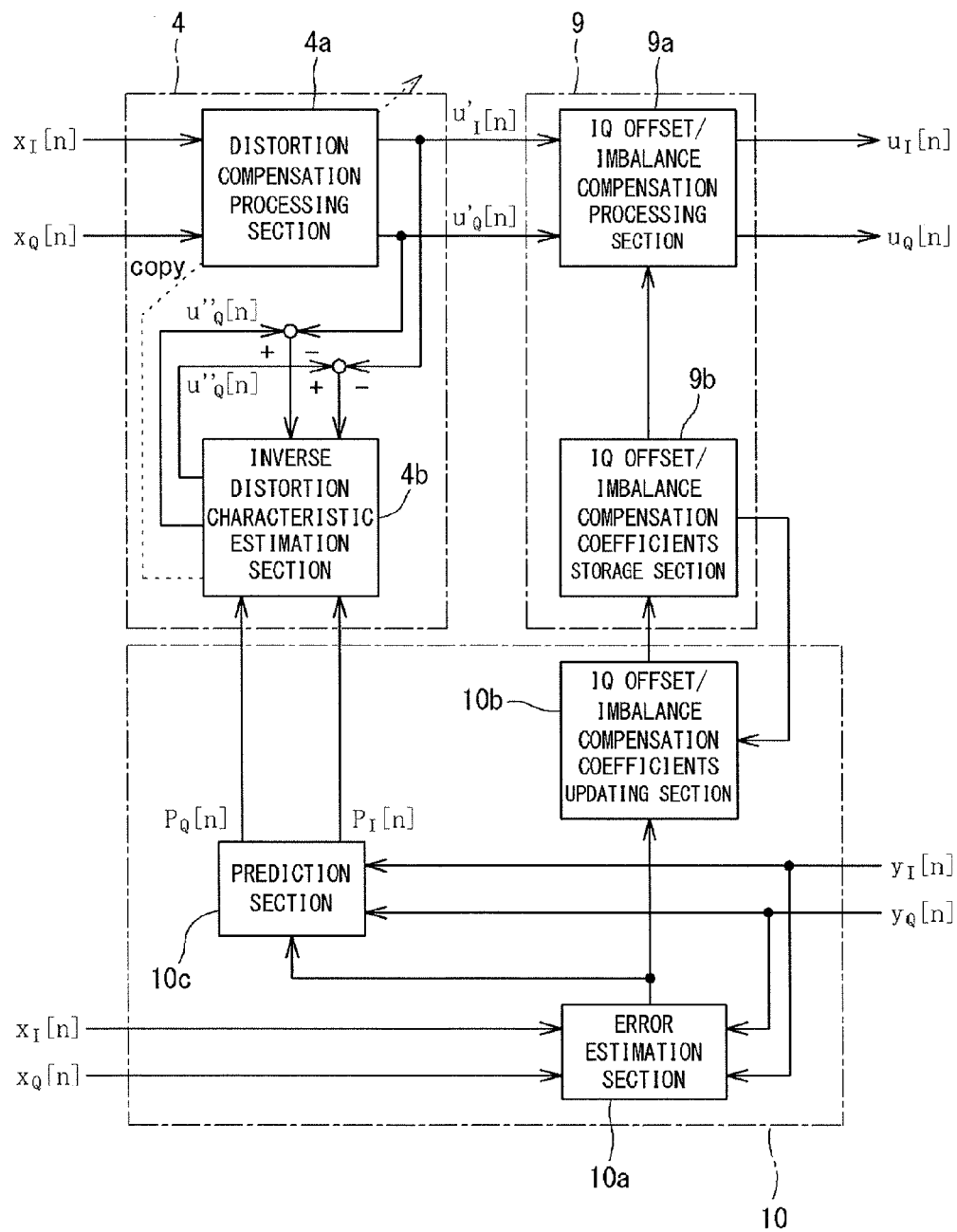
FIG. 2 is a block diagram showing a distortion compensation section, an IQ offset/imbalance compensation section, and a calculation section.

As shown in FIG. 2, the distortion compensation section 4 includes a distortion compensation processing section 4a that performs a process of predistortion for the signal x[n], and an estimation section 4b that estimates a compensation coefficients (first compensation coefficients) that compensates a distortion of the ET amplifier 200. The distortion compensation processing section 4a performs a distortion compensation process by using the first compensation coefficient.

The estimation section 4b of the present embodiment is configured as an inverse distortion characteristic estimation section 4b that estimates a characteristic inverse to that of the ET amplifier 200.

The distortion compensation processing section 4a performs a distortion compensation process for the signal x[n] by using the first compensation coefficients estimated by the estimation section 4b, and outputs the distortion-compensated signal u' [n] ($=u'_I[n]+i \times u'_Q[n]$). Since the signal, which has been compensated with the characteristic inverse to the distortion characteristic of the ET amplifier 200, is given to the ET amplifier 200 side having the distortion characteristic, the distortion of the amplifier output can be suppressed.

The inverse distortion characteristic estimation section 4b obtains the first compensation coefficients by performing a calculation process of estimating the inverse characteristic, based on a prediction value of the amplifier output, which is outputted from a prediction section 10c described later.

The IQ offset/imbalance compensation section 9 is provided on the output side of the distortion compensation section 4 (distortion compensation processing section 4a). The IQ offset/imbalance compensation section (quadrature modulation error compensation section) 9 subjects the IQ baseband signal outputted from the distortion compensation section 4 to a process of compensating IQ offset/imbalance of the quadrature modulator 33. As shown in FIG. 2, the IQ offset/imbalance compensation section 9 includes an IQ offset/imbalance compensation processing section (quadrature modulation error compensation processing section) 9a, and an IQ offset/imbalance compensation coefficients storage section (quadrature modulation error compensation coefficients storage section) 9b.

The IQ offset/imbalance compensation processing section 9a subjects the distortion-compensated signal u' [n] to a process of compensating IQ offset/imbalance by using an IQ offset/imbalance compensation coefficients (second compensation coefficients) stored in the IQ offset/imbalance compensation coefficients storage section 9b, and outputs the compensated signal u[n] ($=u_I[n]+i\times u_Q[n]$).

The IQ offset/imbalance compensation coefficients (second compensation coefficients) stored in the IQ offset/imbalance compensation coefficients storage section 9b is updated by an IQ offset/imbalance compensation coefficients updating section 10b described later. In a state where the second compensation coefficients has never been updated, an initial value such as a zero value is set in the IQ offset/imbalance compensation coefficients storage section 9b.

Referring back to FIG. 1, DA converters (DACs) 32a and 32b for converting (DA converting) the digital signal u[n] to an analog signal u(t) are provided on the output side of the IQ offset/imbalance compensation section 9. The analog IQ baseband signal obtained by the DAC 32 is quadrature-modulated by the quadrature modulator 33.

The quadrature-modulated signal is up-converted by a frequency conversion section 34. The up-converted signal is provided to one or a plurality of driver amplifiers 35a and 35b, and amplified. Outputs from the driver amplifiers 35a and 35b are provided to the amplifier 2 constituting the ET amplifier 200.

An output signal y(t) of the amplifier 2 is detected by a coupler 36, and provided to a frequency conversion section 38 via a variable attenuator (1/G) 37. The frequency conversion section 38 down-converts the signal. The frequency-converted signal is provided to an AD converter (ADC) 40 via a filter (low-pass filter or band-pass filter) 39. The ADC 40 converts the analog signal y(t) to a digital signal y[n] ($=G\times(y_I[n]+i\times y_Q[n])$), and provides its output to a signal processing section 41. The signal processing section 41 performs signal processing such as digital quadrature demodulation, and provides digital IQ baseband signals $y_I[n]$ and $y_Q[n]$ to the calculation section 10.

As shown in FIG. 2, the calculation section 10 includes an error estimation section 10a, an IQ offset/imbalance compensation coefficients updating section (quadrature modulation error compensation coefficients updating section) 10b, and a prediction section 10c.

The error estimation section 10a estimates an error which is caused by that the signals $u_I[n]$ and $u_Q[n]$ outputted from the IQ offset/imbalance compensation section 9 (compensation processing section 9a) are quadrature-modulated in the quadrature modulator 33. The error estimation section 10a estimates the error based on the signals $x_I[n]$ and $x_Q[n]$ and the signals $y_I[n]$ and $y_Q[n]$. The manner of estimating the error will be described later.

The IQ offset/imbalance compensation coefficients updating section 10b updates the second compensation coefficients stored in the IQ offset/imbalance compensation coefficients storage section 9b. The IQ offset/imbalance compensation coefficients updating section 10b updates the second compensation coefficients stored in the IQ offset/imbalance compensation coefficients storage section 9b, by using the error estimated by the error estimation section 10a. The manner of updating the second compensation coefficients will be described later.

The prediction section 10c calculates prediction values $P_I[n]$ and $P_Q[n]$ of the output of the amplifier 2 after the updating of the second compensation coefficients based on the error. The prediction section 10c calculates the prediction values based on the error used for the updating of the second compensation coefficient, and the outputs $y_I[n]$ and $y_Q[n]$ of the amplifier 2 before the updating of the second compensation coefficients based on the error. The manner of calculating the prediction values will be described later.

The names of the signals shown in the figures will be described below.

x[n] is a signal before subjected to distortion compensation by the distortion compensation section 4, $x_I[n]$ is a real part (I-channel) of x[n], and $x_Q[n]$ is an imaginary part (Q-channel) of x[n]. That is, $x[n]=x_I[n]+i\times x_Q[n]$ is satisfied.

u' [n] is a signal after subjected to distortion compensation by the distortion compensation section 4, $u_I'[n]$ is a real part (I-channel) of u'[n], and $u_Q'[n]$ is an imaginary part (Q-channel) of u'[n]. That is, $u'[n]=u_I'[n]+i\times u_Q'[n]$ is satisfied.

u"[n] is a replica signal of the signal u'[n] after subjected to distortion compensation by the distortion compensation section 4, $u_I"[n]$ is a real part (I-channel) of u"[n], and $u_Q"[n]$ is an imaginary part (Q-channel) of u"[n]. That is, $u"[n]=u_I"[n]+i\times u_Q"[n]$ is satisfied.

u[n] is a signal after subjected to IQ offset/imbalance compensation by the IQ offset/imbalance compensation section 9, $u_I[n]$ is a real part (I-channel) of u[n], and $u_Q[n]$ is an imaginary part (Q-channel) of u[n]. That is, $u[n]=u_I[n]+i\times u_Q[n]$ is satisfied.

y[n] is an output signal of the amplifier 2, $y_I[n]$ is a real part (I-channel) of y[n], and $y_Q[n]$ is an imaginary part (Q-channel) of y[n]. That is, $y[n]=G\times(y_I[n]+i\times y_Q[n])$ is satisfied.

P[n] is a prediction value of an output signal of the amplifier 2, $P_I[n]$ is a real part (I-channel) of P[n], and $P_Q[n]$ is an imaginary part (Q-channel) of P[n]. That is, $P[n]=P_I[n]+i\times P_Q[n]$ is satisfied.

[2. Distortion Due to Quadrature Modulation Error, and Nonlinear Distortion of Amplifier]

Figure 3:
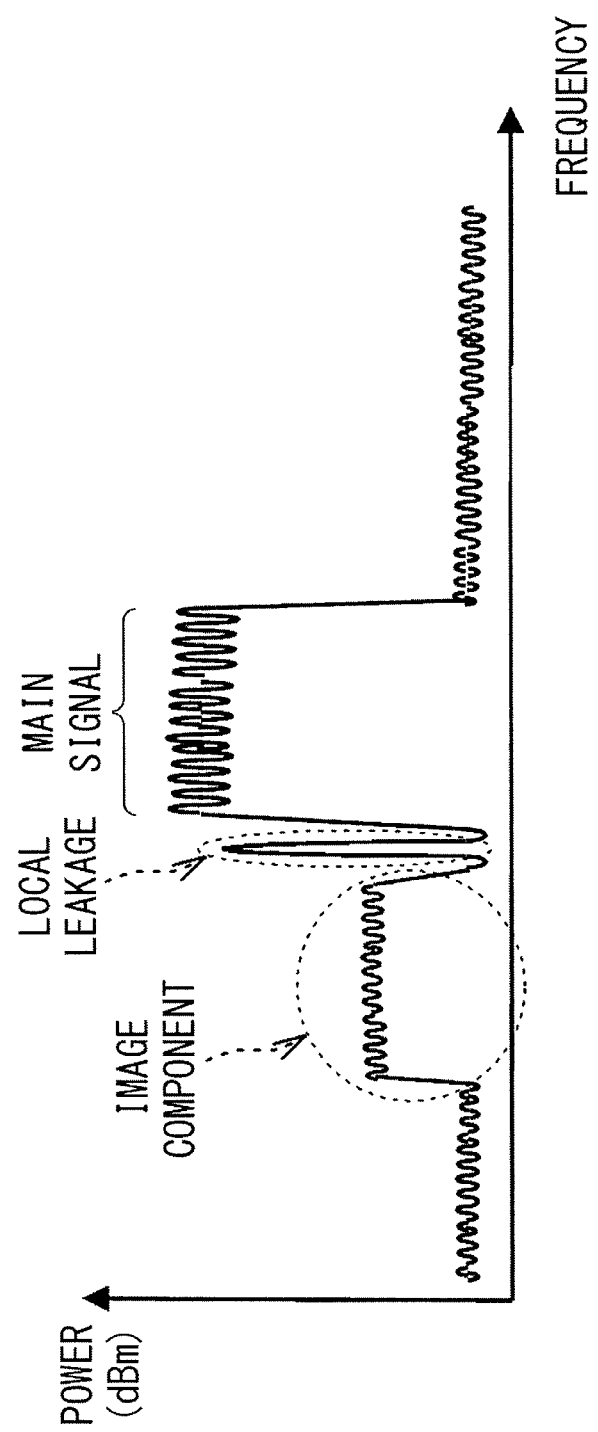
FIG. 3 is a diagram showing quadrature modulation error distortions.

FIG. 3 shows distortions of a signal due to a quadrature modulation error (IQ offset/imbalance) in the quadrature modulator 33. FIG. 3 shows, in addition to a component of a normal signal (main signal) x[n], a local leakage and an image component which are signal distortions due to the quadrature modulation error. The local leakage is caused by a deviation of an IQ DC offset and/or a leakage of a carrier wave in the quadrature modulator 33. The image component is caused by a quadrature deviation of the quadrature modulator and/or an IQ gain imbalance.

The IQ offset/imbalance compensation section (quadrature modulation error compensation section) 9 serves to reject the local leakage and the image component which are signal distortions due to the quadrature modulation error.

Figure 4:
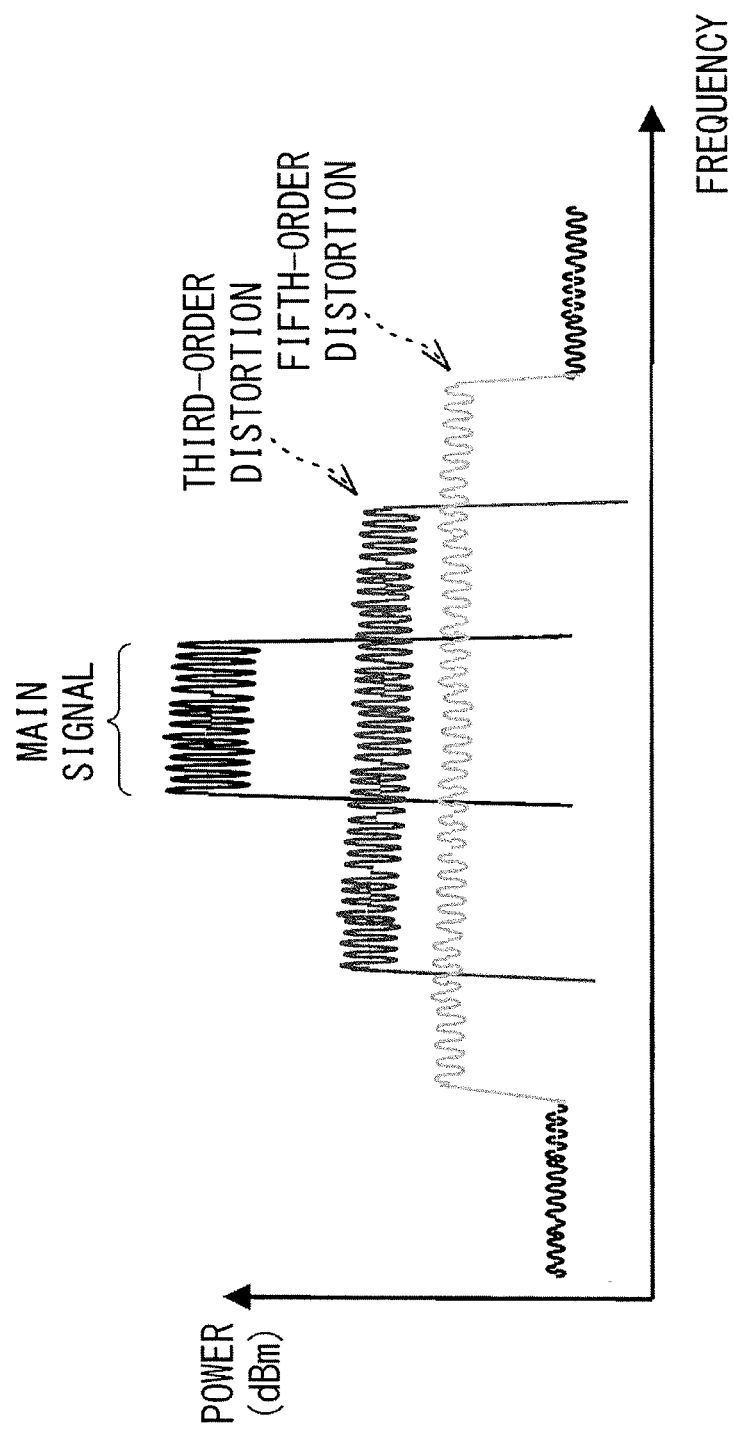
FIG. 4 is a diagram showing nonlinear distortions of an amplifier.

On the other hand, FIG. 4 shows distortions caused by the nonlinear characteristic of the amplifier 2. FIG. 4 shows, in addition to the component of the normal signal (main signal) x[n], a third-order distortion and a fifth-order distortion.

The distortion compensation section 4 serves to reject the distortions caused by the nonlinear characteristic of the amplifier 2, such as the third-order distortion and the fifth-order distortion.

Figure 5:
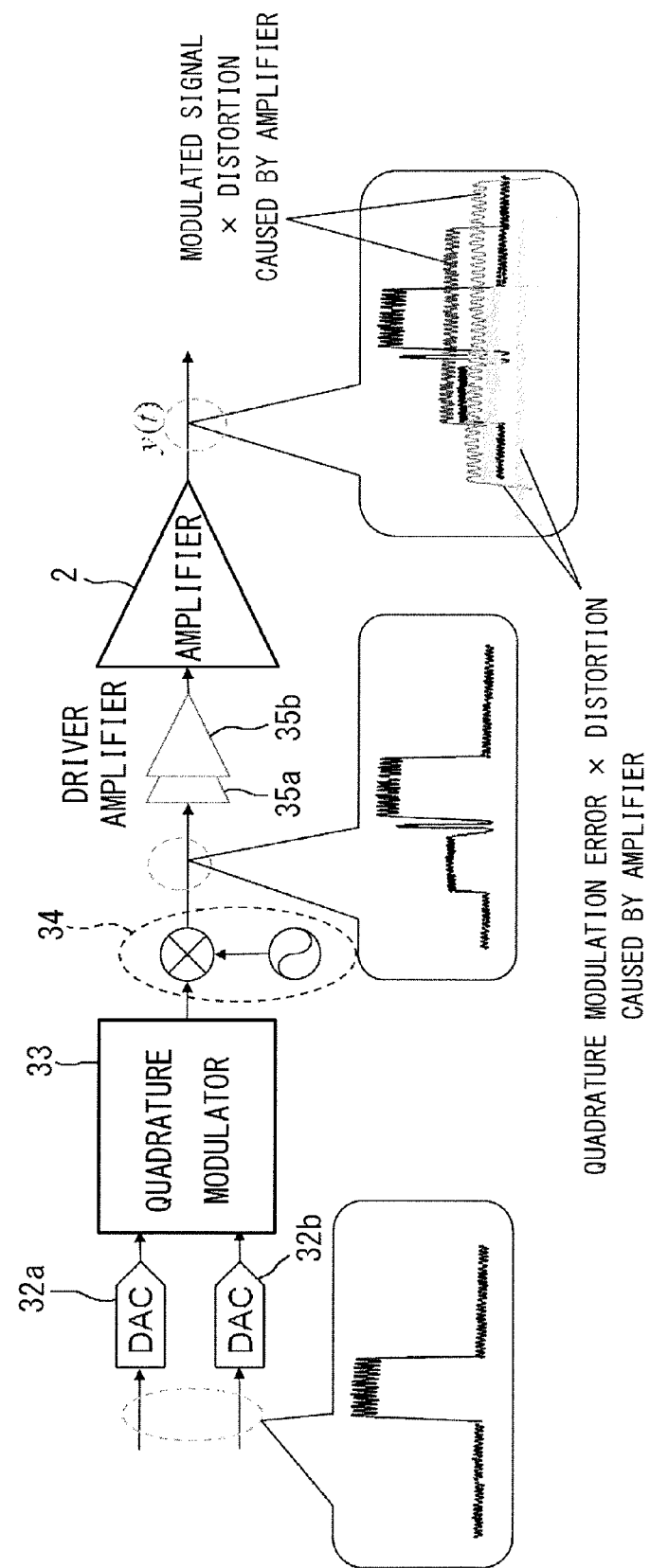
FIG. 5 is a diagram showing a state where the quadrature modulation error distortions and the nonlinear distortions of the amplifier are superimposed on one another.

As shown in FIG. 5, although the normal signal having no distortion is given to the DACs 32a and 32b in the amplifier circuit 1, the signal passes through the DACs 32a and 32b, the quadrature modulator 33, and the frequency conversion section 34, and thereby a local leakage and an image component occur in the quadrature-modulated main signal. Then, the signal (quadrature-modulated main signal; modulated signal) having the local leakage and the image component passes through the amplifier 2, and thereby the nonlinear distortion of the amplifier 2 is additionally superimposed.

In FIG. 5, in order to facilitate understanding, the quadrature modulation error distortion of the quadrature modulator 33 and the nonlinear distortion of the amplifier 2 are separately shown. However, actually, one of the quadrature modulation error distortion and the nonlinear distortion of the amplifier 2, which is smaller in power, is masked by the other distortion which is larger in power, and therefore, cannot be observed.

Accordingly, mere observation of the output y(t) of the amplifier 2 cannot distinguish whether a distortion signal is caused by the quadrature modulator 33 or the amplifier 2.

However, in the amplifier circuit 1 of the present embodiment, even under the situation where two different kinds of distortions are present, compensation of the quadrature modulator 33 and compensation of the amplifier 2 can be performed without separating the two kinds of distortions.

[3. Calculation Process for Compensation]

[3.1 Outline of QMC (Quadrature Modulator Correction)]

Figure 6:
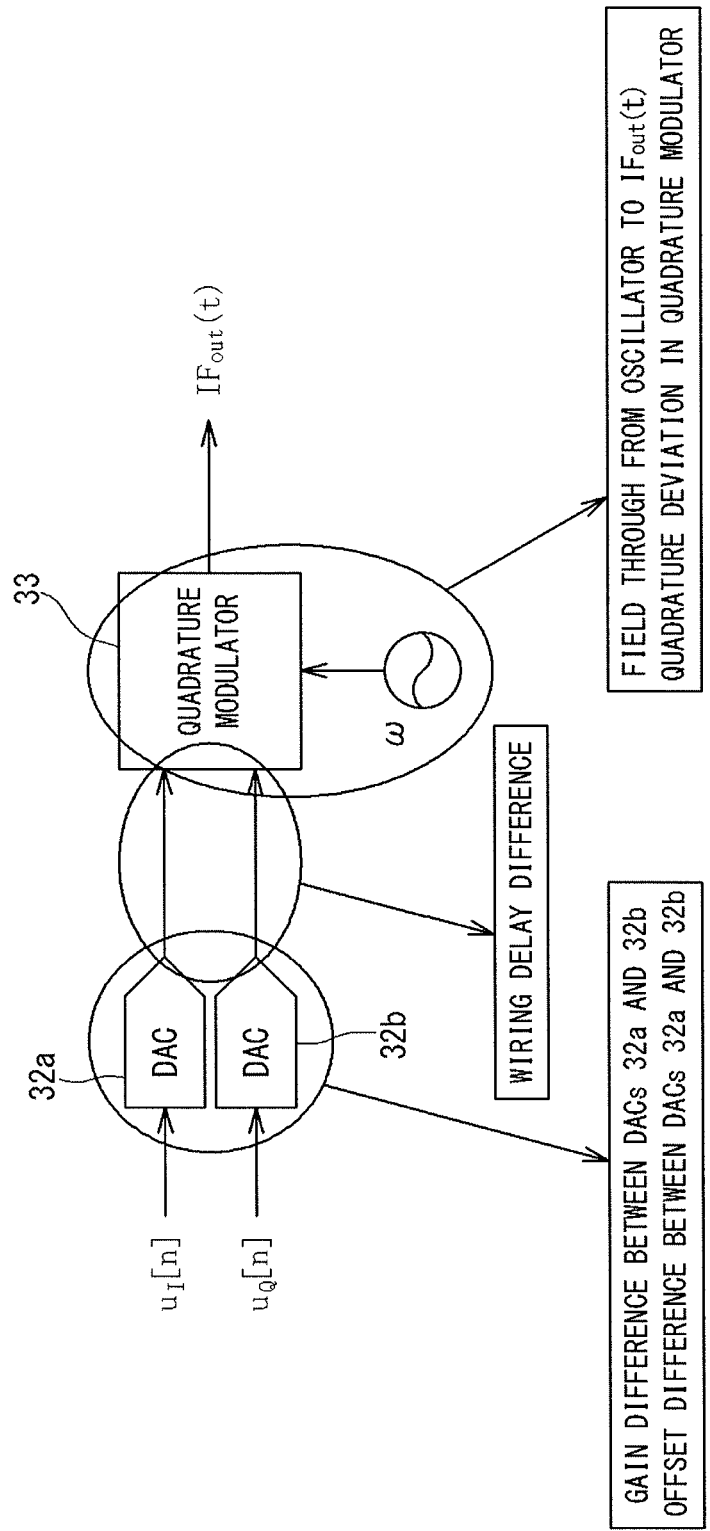
FIG. 6 is a diagram showing errors generated in a path from DACs to a quadrature modulator.

FIG. 6 shows errors (quadrature modulation errors) that occur in the path from the DACs 32a and 32b to the quadrature modulator 33. In the DACs 32a and 32b, a gain difference and an offset difference occur between the I and Q components. Further, in a wiring between the DACs 32a and 32b and the quadrature modulator 33, a wiring delay difference occurs between the I and Q components. Further, in the quadrature modulator 33, a feed through from an oscillator to $IF_{out}(t)$ and a quadrature deviation in the quadrature modulator 33 might occur.

Figure 7:
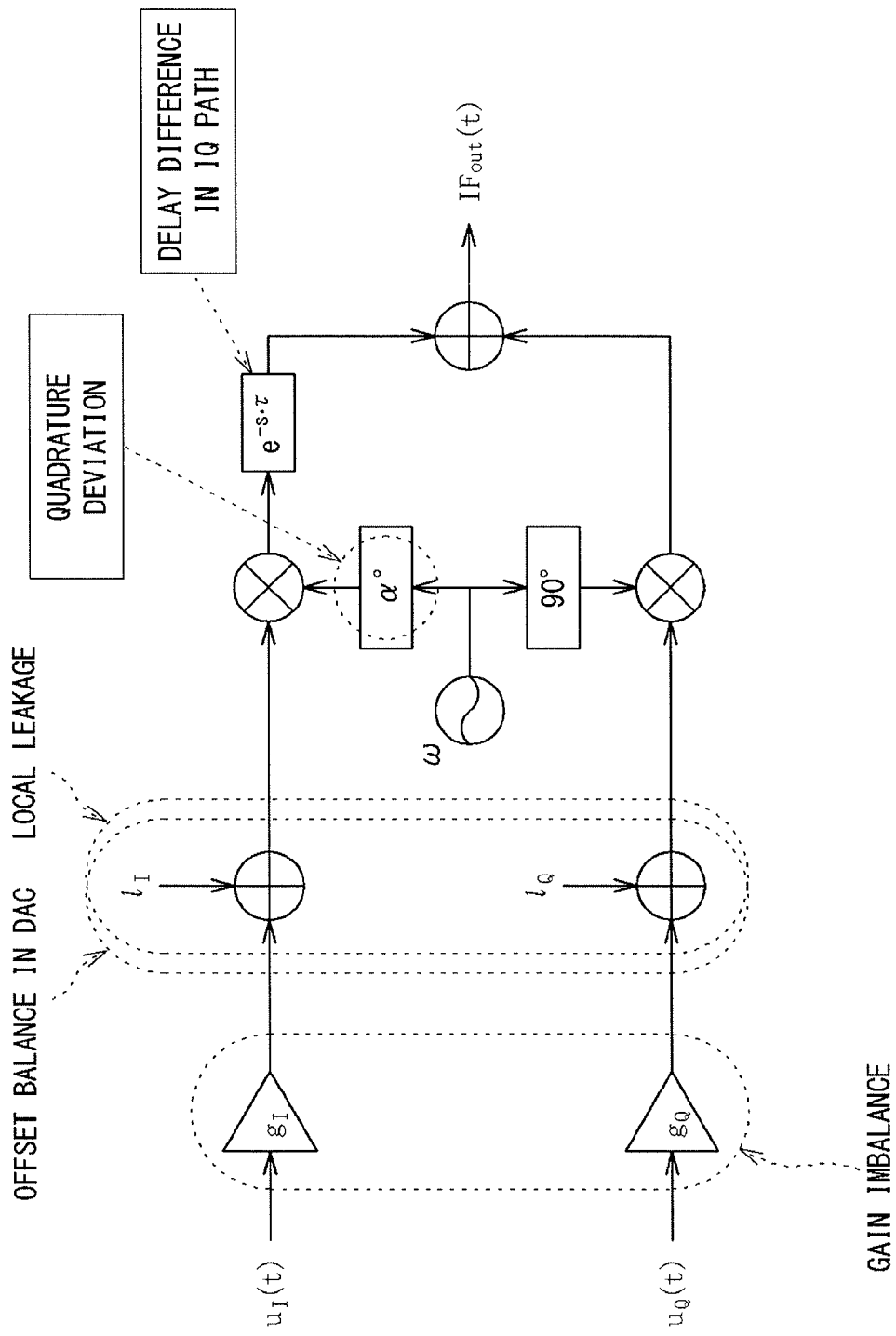
FIG. 7 shows an equivalent model of the DACs and the quadrature modulator.

FIG. 7 shows an equivalent model of the DACs 32a and 32b and the quadrature modulator 33 in which the above-mentioned errors occur. All the signals are considered to be analog signals.

Assuming that an output of the quadrature modulator 33 is $IF_{out}(t)$, from FIG. 7, the $IF_{out}(t)$ is expressed as in the following equation 1:

[Equation 1]
$$IF_{out}(t) = (g_I \cdot u_I(t) + l_I) \times \sin(\omega(t - \tau) + \alpha) + (g_Q \cdot u_Q(t) + l_Q) \times \sin\left(\omega t + \frac{\pi}{2}\right)$$
$$= (g_I \cdot u_I(t) + l_I) \cdot \cos(\alpha - \omega \cdot \tau) \times \sin(\omega t) + \{-(g_I \cdot u_I(t) + l_I) \cdot$$
$$\sin(\alpha - \omega \cdot \tau) + g_Q \cdot u_Q(t) + l_Q\} \times \sin\left(\omega t + \frac{\pi}{2}\right)$$

When the following equation 2 is substituted for the equation 1,

[Equation 2]
$$IF_{out}(t) = u_{I\_out}(t) \times \sin(\omega t) + u_{Q\_out}(t) \times \sin\left(\omega t + \frac{\pi}{2}\right)$$

the following equation 3 results from the above two equations:

[Equation 3]
$$\begin{cases} U_{I\_out}(t) = g_I \cdot \cos(\alpha - \omega \cdot \tau) \times u_I(t) + l_I \cdot \cos(\alpha - \omega \cdot \tau) \\ U_{Q\_out}(t) = -g_I \cdot \sin(\alpha - \omega \cdot \tau) \times u_I(t) + g_Q \cdot u_Q(t) + \\ (l_Q - l_I \cdot \sin(\alpha - \omega \cdot \tau)) \end{cases}$$

$$\begin{pmatrix} u_{I\_out}(t) \\ u_{Q\_out}(t) \end{pmatrix} = \begin{pmatrix} g_I \cdot \cos(\alpha - \omega \cdot \tau) & 0 \\ -g_I \cdot \cos(\alpha - \omega \cdot \tau) & g_Q \end{pmatrix} \begin{pmatrix} u_I(t) \\ u_Q(t) \end{pmatrix} +$$
$$\begin{pmatrix} l_I \cdot \cos(\alpha - \omega \cdot \tau) \\ l_Q - l_I \cdot \sin(\alpha - \omega \cdot \tau) \end{pmatrix}$$

Figure 8:
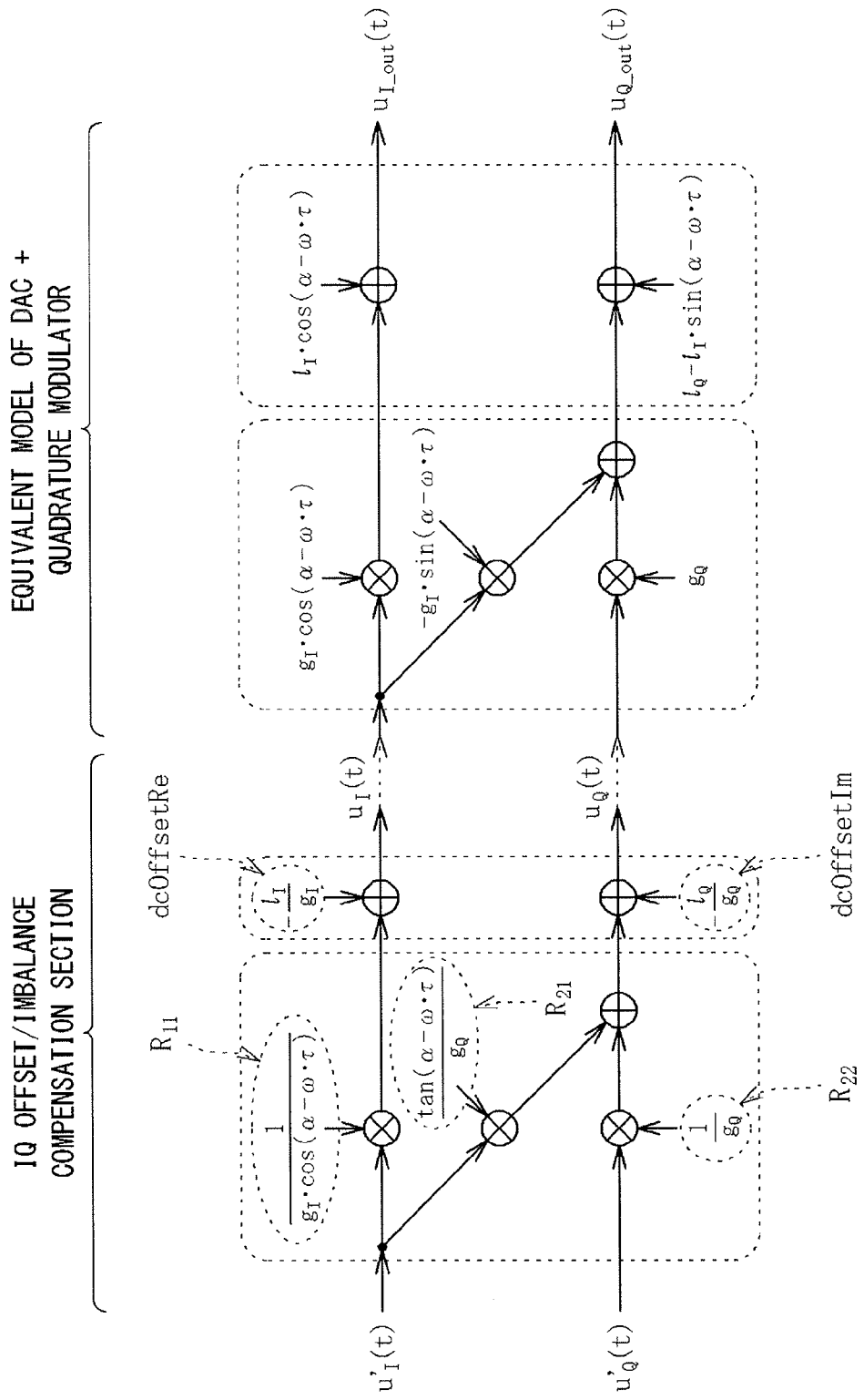
FIG. 8 shows an equivalent model of the DACs and the quadrature modulator, and a model of an IQ offset/imbalance compensation section for correcting quadrature modulation errors in the equivalent model.

FIG. 8 shows an equivalent model (DACs 32a and 32b and quadrature modulator 33) based on the above equations, and a model of the IQ offset/imbalance compensation section 9 for correcting quadrature modulation errors in the equivalent model.

According to the definitions of symbols $R_{11}$, $R_{21}$, $R_{22}$, dcOffsetRe, and dcOffsetIm shown in the model of the IQ offset/imbalance compensation section 9 in FIG. 8, the IQ offset/imbalance compensation section 9 can be expressed by the following equation:

[Equation 4]
$$\begin{pmatrix} u_I(t) \\ u_Q(t) \end{pmatrix} = \begin{pmatrix} R_{11} & 0 \\ R_{21} & R_{22} \end{pmatrix} \begin{pmatrix} u'_I(t) \\ u'_Q(t) \end{pmatrix} + \begin{pmatrix} dcOffsetRe \\ dcOffsetIm \end{pmatrix}$$

Each of $R_{11}$, $R_{21}$, $R_{22}$, dcOffsetRe, and dcOffsetIm is second compensation coefficients (IQ offset/imbalance compensation coefficients) used for compensation in the IQ offset/imbalance compensation section 9. The IQ offset/imbalance compensation coefficients storage section (quadrature modulation error compensation coefficients storage section) 9b stores these second compensation coefficients, and the IQ offset/imbalance compensation coefficients updating section (quadrature modulation error compensation coefficients updating section) 10b updates these second compensation coefficients.

Each of the second compensation coefficients converges to an appropriate value (optimum value) through a plurality of times of updating. Accordingly, the second compensation coefficients before convergence contains an error (residual error) with respect to the optimum value.

[3.2 Outline of DPD (Digital Pre-Distortion; Digital Distortion Compensation)]

As shown in FIG. 2, the inverse distortion characteristic estimation section 4b of the distortion compensation section 4 according to the present embodiment estimates a replica signal u"[n] of the signal u'[n] after subjected to distortion compensation by the distortion compensation section 4.

In the inverse distortion characteristic estimation section 4b, a prediction value P[n] of an output from the amplifier 2 is subjected to distortion compensation based on the amplifier inverse model (a model indicated by the first compensation coefficient) currently possessed by the inverse distortion characteristic estimation section 4b, thereby obtaining a replica signal u"[n] of the signal u'[n] after subjected to distortion compensation by the distortion compensation section 4.

Then, the inverse distortion characteristic estimation section 4b obtains an error between the signal u'[n] after subjected to distortion compensation by the distortion compensation section 4 and the replica signal u"[n] thereof, and optimizes the inverse model (first compensation coefficient)

so as to minimize the error. The inverse model (first compensation coefficient) thus obtained is copied to the distortion compensation processing section 4a, and used for the distortion compensation process in the distortion compensation processing section 4a. The first compensation coefficients also converge to an appropriate value (optimum value) through a plurality of times of estimation.

The method of distortion compensation by the distortion compensation section 4 is not limited to that described above.

[3.3 Calculation of First Compensation Coefficients and Second Compensation Coefficients]

Figure 9:
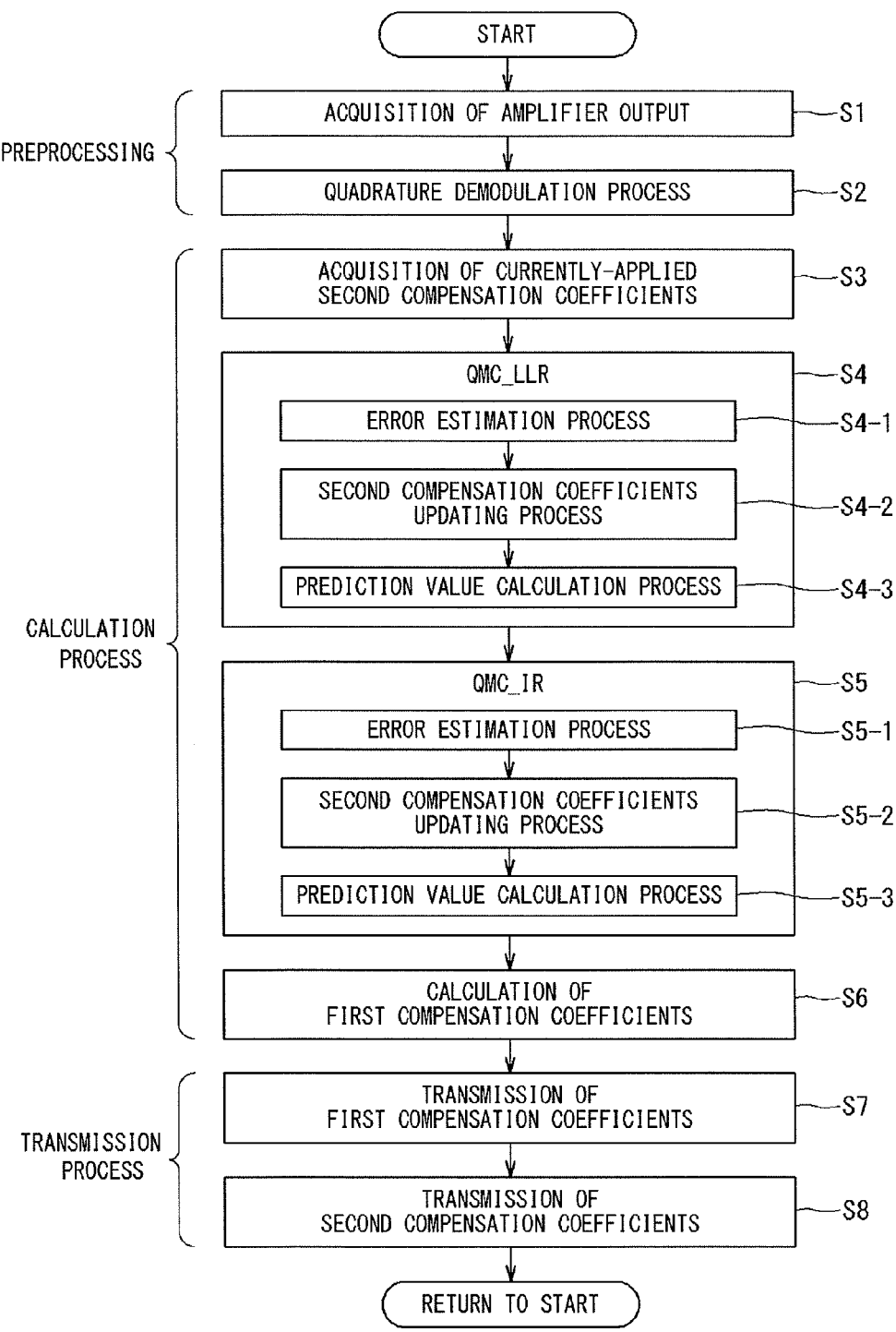
FIG. 9 is a flowchart showing a process of calculating first compensation coefficients and second compensation coefficients.

FIG. 9 is a flowchart showing a process of calculating the first compensation coefficients and the second compensation coefficients. The flowchart of FIG. 9 shows processes performed by the signal processing section 41, the calculation section 10, and the inverse distortion characteristic estimation section 4b. The signal processing section 41 performs steps S1 and S2 in FIG. 9, and the calculation section 10 performs steps S3 to S8 in FIG. 9.

The process shown in FIG. 9 is performed by a computer (not shown), included in the amplifier circuit 1, executing a computer program. The computer program is stored in a storage medium (memory) (not shown) included in the amplifier circuit 1.

First, as preprocessing, acquisition of an amplifier output (step S1), quadrature demodulation (step S2), and the like are performed. In step S1, the signal processing section 41 acquires an amplifier output signal y[n] outputted from the ADC 40. In step S2, the signal processing section 41 performs quadrature demodulation for the acquired amplifier output signal y[n], and outputs IQ signals $y_I[n]$ and $y_Q[n]$. The IQ signals $y_I[n]$ and $y_Q[n]$ outputted from the signal processing section 41 are provided to the calculation section 10.

Upon receiving the IQ signals $y_I[n]$ and $y_Q[n]$ as the amplifier output, the calculation section 10 acquires, from the IQ offset/imbalance compensation coefficients storage section 9b, the second compensation coefficients $R_{11}$, $R_{12}$, $R_{21}$, $R_{22}$, dcOffsetRe, and dcOffsetIm which are currently applied (step S3).

The amplifier outputs $y_I[n]$ and $y_Q[n]$ that have been acquired by the calculation section 10 are signals obtained when the IQ signals $u_I[n]$ and $u_Q[n]$, which have been subjected to IQ offset/imbalance compensation by the IQ offset/imbalance compensation section 9 by using the second compensation coefficients acquired by the calculation section 10, pass through the quadrature modulator 33 and the amplifier 2.

Subsequently, the calculation section 10 performs a QMC_LLR (QMC_Local Leak Rejection) process (step S4). The QMC_LLR process includes a process of calculating second compensation coefficients (dcOffsetRe, dcOffsetIm) for canceling the local leakage shown in FIG. 3 by rejecting a DC offset and a carrier wave leakage that occur in the path from the DACs 32a and 32b to the quadrature modulator 33, and other processes. The QMC_LLR process includes an error estimation process (step S4-1), second compensation coefficients updating process (step S4-2), and a prediction value calculation process (step S4-3).

In the error estimation process (step S4-1), the error estimation section 10a in the calculation section 10 estimates a local leakage as an IQ offset/imbalance.

If the second compensation coefficients is an optimum value, a quadrature modulation error distortion (IQ offset/imbalance) caused by the quadrature modulator 33 is completely canceled by the IQ offset/imbalance compensation section 9, and the IQ offset/imbalance becomes zero.

However, before the second compensation coefficients converges to the optimum value, even if the IQ offset/imbalance compensation section 9 performs the compensation process, a certain amount of IQ offset/imbalance (quadrature modulation error) remains uncompensated because the second compensation coefficients is not appropriate.

So, in the error estimation process of step S4-1, in order to bring the second compensation coefficients close to the optimum value, a local leakage amount (first error), of the IQ offset/imbalance, is estimated. The local leakage amount can be calculated by comparing the IQ signals $x_I[n]$ and $x_Q[n]$ before subjected to compensation (signals before subjected to distortion compensation) and the IQ signals $y_I[n]$ and $y_Q[n]$ as the actual amplifier output.

If a local leakage is contained in the amplifier output, a zero point on a constellation of the IQ signals $x_I[n]$ and $x_Q[n]$ before subjected to compensation (signals before subjected to distortion compensation) and a zero point on a constellation of the IQ signals $y_I[n]$ and $y_Q[n]$ as the amplifier output deviate from each other. In the present embodiment, this feature is utilized for calculation of a local leakage amount.

Hereinafter, an example of an actual algorithm for calculating a current local leakage amount (first error) will be described.

[Equation 5]
```
LocalLeak_re = 0;
LocalLeak_im = 0;
for(n = 0; n < DATALEN ; n + +)
    LocalLeak_re+ = (Rxsig_re[n] − Refsig_re[n] )
    LocalLeak_im+ = (Rxsig_im[n] − Refsig_im[n] )
end
LocalLeak_re/ = DATALEN ;
LocalLeak im/ = DATALEN ;
```

Usage of operators in the above algorithm is based on usage of operators in a general programming language such as C programming language (the same applies hereinafter).

Meanings of variables in the above algorithm are as follows (the same applies hereinafter).

LocalLeak_re : dcOffsetRe (a real part of the local leakage amount (complex number))
LocalLeak_im : dcOffsetIm (an imaginary part of the local leakage amount (complex number))
Refsig_re : $x_I[n]$
Refsig_im : $x_Q[n]$
Rxsig_re : $y_I[n]$
Rxsig_im : $y_Q[n]$
DATALEN : number of data In the above algorithm, for simplification, an average value of differences between the IQ signals $x_I[n]$, $x_Q[n]$ before subjected to compensation (signals before subjected to distortion compensation) and the IQ signals $y_I[n]$, $y_Q[n]$ as the actual amplifier output is regarded as an amount of zero point deviation.

In the above algorithm, first two rows correspond to a process of initializing the local leakage amount to zero.

Subsequent four rows correspond to a calculation to calculate a sum of differences between $x_I[n]$, $x_Q[n]$ and $y_I[n]$, $y_Q[n]$.

The last two rows correspond to a calculation to calculate an average value of the differences between $x_I[n]$, $x_Q[n]$ and $y_I[n]$, $y_Q[n]$ by dividing the calculated sum by the number of data (DATALEN).

The LocalLeak_re and LocalLeak_im after execution of the above algorithm indicate the current local leakage amounts included in the amplifier outputs $y_I[n]$ and $y_Q[n]$, respectively.

The amplifier output is obtained when a signal which has been subjected to IQ offset/imbalance compensation using the second compensation coefficients that is currently applied, passes through the quadrature modulator 33 and the like. Therefore, the current local leakage amounts Local-Leak_re and LocalLeak_im calculated in the above algorithm do not correspond to the total amount of local leakage that actually occurs due to the quadrature modulator 33 but correspond to an amount of local leakage that remains as an error due to the second compensation coefficients that is not the optimum value.

In the second compensation coefficients updating process (step S4-2), the IQ offset/imbalance compensation coefficients updating section 10b updates dcOffsetRe and dcOffsetIm which are the second compensation coefficients for canceling the local leakage, by using the local leakage amount (first error) obtained in step S4-1.

In the present embodiment, the second compensation coefficients dcOffsetRe and dcOffsetIm relating to the local leakage are each calculated as a cumulative value (integral value) of a plurality of local leakage amounts (first errors) repeatedly calculated.

Accordingly, in the second compensation coefficients updating process (step S4-2), a value for canceling the currently calculated local leakage amount (typically, a value obtained by inverting the sign of the local leakage amount) is added to dcOffsetRe and dcOffsetIm currently used in the IQ offset/imbalance compensation section 9. Thereby, updated values of dcOffsetRe and dcOffsetIm are obtained. However, even after the calculation in step S4-2 has been completed, the updated values of dcOffsetRe and dcOffsetIm are merely stored in the IQ offset/imbalance compensation coefficients storage section 9b, but are not transferred to the IQ offset/imbalance compensation processing section 9a. That is, at this point in time, the updated values of dcOffsetRe and dcOffsetIm are not yet used in the IQ offset/imbalance compensation processing section 9a.

Updating equations used in the second compensation coefficients updating process of step S4-2 are as follows.

$$QMCCoeffI[2] \mathrel{-}= LocalLeak\_re;$$

$$QMCCoeffQ[2] \mathrel{-}= LocalLeak\_im; \quad \text{[Equation 6]}$$

Meanings of variables in the above updating equations are as follows.
QMCCoeffI[2]: dcOffsetRe
QMCCoeffQ[2]: dcOffsetIm In the above updating equations, LocalLeak_re and LocalLeak_im are added to QMCCoeffI[2] and QMCCoeffQ[2], respectively. Since QMCCoeffI[2] and QMCCoeffQ[2] are each a value for canceling the local leakage, the right-hand value of each updating equation, whose sign is changed to minus, is added.

In the prediction value calculation process (step S4-3), in order to calculate the first compensation coefficient, a calculation for predicting prediction values $P_I[n]$ and $P_Q[n]$ of the output of the amplifier 2 (the first half of the prediction value calculation) is performed. At the point in time corresponding to step S4-3, the updating results of the second compensation coefficients (dcOffsetRe, dcOffsetIm) are not reflected in the IQ offset/imbalance compensation section 9 side, and the amplifier outputs $y_I[n]$ and $y_Q[n]$ after updating of the second compensation coefficients (dcOffsetRe, dcOffsetIm) are not obtained yet.

Therefore, in the prediction value calculation process (step S4-3), the prediction values $P_I[n]$ and $P_Q[n]$ of the amplifier output after updating of the second compensation coefficients (dcOffsetRe, dcOffsetIm) based on the error are calculated, and the prediction values are used for calculation of the first compensation coefficient.

Specifically, in the prediction value calculation process (step S4-3), calculation of subtracting the local leakage amounts from the IQ signals $y_I[n]$ and $y_Q[n]$ as the amplifier output is performed. Equations for the calculation are as follows. The prediction values obtained in step S4-3 are those in the middle of the prediction value calculation (temporary prediction values), but are not final prediction values. The final prediction values are obtained in step S5-3 described later.

[Equation 7]
```
for (n = 0; n < DATALEN; n + +)
    P_re[n] = Rxsig_re[n] - LocalLeak_re;
    P_im[n] = Rxsig_im[n] - LocalLeak_im;
end
```

Meanings of variables in the above equations are as follows.
P_re: $P_I[n]$
P_im: $P_Q[n]$ Next, the calculation section 10 performs a QMC_IR (QMC_image Rejection) process (step S5). The QMC_IR process includes a process of calculating second compensation coefficients ($R_{11}$, $R_{21}$, $R_{22}$) for canceling the image component shown in FIG. 3 by rejecting an IQ gain imbalance and a quadrature deviation which occur in the path from the DACs 32a and 32b to the quadrature modulator 33, and other processes. The QMC_IR process includes an error estimation process (step S5-1), second compensation coefficients updating process (step S5-2), and a prediction value calculation process (step S5-3).

In the error estimation process of step S5-1, in order to bring the second compensation coefficients close to the optimum value, the error estimation section 10a in the calculation section 10 estimates, of the IQ offset/imbalance, an IQ gain imbalance and a quadrature deviation (second error).

Regarding the IQ gain imbalance and the quadrature deviation, IQ signals Refsig_re($x_I$) and Refsig_im($x_Q[n]$) before subjected to compensation, and amplifier output IQ signals Rxsig_re($y_I$) and Rxsig_im($y_Q[n]$) are expressed as follows.

$$\begin{pmatrix} Rxsig\_re[n] \\ Rxsig\_im[n] \end{pmatrix} = \begin{pmatrix} Rtmp_{11} & 0 \\ Rtmp_{21} & Rtmp_{22} \end{pmatrix} \begin{pmatrix} Refsig\_re[n] \\ Refsig\_im[n] \end{pmatrix} \quad \text{[Equation 8]}$$

Then, $R_{tmp11}$, $R_{tmp21}$, and $R_{tmp22}$ in the above equation are estimated so as to satisfy the following relation:

$$Rtmp_{11} \cdot Rtmp_{22} = 1 \quad \text{[Equation 9]}$$

Thereby, it is possible to compensate the IQ gain imbalance and the quadrature deviation.

First, quadrature deviations $R_{tmp21}$ and $R_{tmp22}$ can be calculated by solving the following equation by a least squares method (normal equation).

$$Rxsig\_im[n] = Rtmp_{21} \cdot Refsig\_re[n] + Rtmp_{22} \cdot Refsig\_im[n] \quad \text{[Equation 10]}$$

An example of an algorithm (least squares method) for calculating $R_{tmp21}$ and $R_{tmp22}$ is as follows.

$$\begin{aligned}
&X1Y = 0;\ X2Y = 0;\ X1X1 = 0;\ X1X2 = 0;\ X2X2 = 0;\\
&\text{for}(n = 0;\ n < \text{DATALEN};\ n++)\\
&\quad X1Y +=  \text{Refsig\_re}[n] \times \text{Rxsig\_im}[n];\\
&\quad X2Y +=  \text{Refsig\_im}[n] \times \text{Rxsig\_im}[n];\\
&\quad X1X1 +=  \text{Refsig\_re}[n] \times \text{Refsig\_re}[n];\\
&\quad X1X2 +=  \text{Refsig\_re}[n] \times \text{Refsig\_im}[n];\\
&\quad X2X2 +=  \text{Refsig\_im}[n] \times \text{Refsig\_im}[n];\\
&\text{end}
\end{aligned}$$

[Equation 11]

$$Rtmp_{21} = -\frac{(X2X2) \times X1Y - X1X2 \times X2Y}{(X1X2)^2 - X1X1 \times X2X2};$$

$$Rtmp_{22} = -\frac{(X1X1) \times X2Y - X1X2 \times X1Y}{(X1X2)^2 - X1X1 \times X2X2};$$

Now, IQ gain imbalances $R_I$ and $R_Q$ are calculated. $R_I$ is an average gain of the I signal, and $R_Q$ is an average gain of the Q signal. Since the same envelope voltage is applied to the amplifier 2 through which a pair of I and Q signals pass, the average gains of the I and Q signals that occur in the amplifier 2 should be the same.

The IQ gain imbalances $R_I$ and $R_Q$ are calculated as follows. $R_I = R_{tmp11}$ is satisfied.

$$\begin{aligned}
&\text{RefPowerI} = 0;\ \text{RefPowerQ} = 0;\\
&\text{RxPowerI} = 0;\ \text{RxPowerQ} = 0;\\
&\text{for}(n = 0;\ n < \text{DATALEN};\ n++)\\
&\quad \text{RefPowerI} += \text{Refsig\_re}[n] \times \text{Refsig\_re}[n];\\
&\quad \text{RefPowerQ} += \text{Refsig\_im}[n] \times \text{Refsig\_im}[n];\\
&\quad \text{RxPowerI} += \text{Rxsig\_re}[n] \times \text{Rxsig\_re}[n];\\
&\quad \text{RxPowerQ} += \text{Rxsig\_im}[n] \times \text{Rxsig\_im}[n];\\
&\text{end}
\end{aligned}$$

[Equation 12]

$$R_I = \sqrt{\frac{\text{RefPowerI}}{\text{RxPowerI}}};$$

$$R_Q = \sqrt{\frac{\text{RefPowerQ}}{\text{RxPowerQ}}};$$

Subsequently, the previously calculated quadrature deviations $R_{tmp21}$ and $R_{tmp22}$ are normalized by $R_Q$ as follows.

$$Norm_Q = \frac{R_Q}{\sqrt{Rtmp_{21} \times Rtmp_{21} + Rtmp_{22} \times Rtmp_{22}}};$$

[Equation 13]

$$Rtmp_{21} = Norm_Q \times Rtmp_{21};$$

$$Rtmp_{22} = Norm_Q \times Rtmp_{22};$$

In the second compensation coefficients updating process of step S5-2, the IQ offset/imbalance compensation coefficients updating section 10*b* updates the second compensation coefficients $R_{11}$, $R_{21}$, and $R_{22}$ for canceling the image component, by using $R_{tmp21}$, $R_{tmp22}$, and $R_I$ obtained in step S5-1.

Updating equations used in the second compensation coefficients updating process of step S5-2 are shown below. NormR is a variable for normalization with a compensation matrix norm for correction of the quadrature modulator being maintained at 1.

$$NormR = $$

[Equation 14]

$$(R_I \times QMCCoeffI[0]) \times (Rtmp_{22} \times QMCCoeffQ[1]);$$

$$QMCCoeffI[0] = \frac{R_I \times QMCCoeffI[0]}{NormR};$$

$$QMCCoeffI[1] = \frac{-Rtmp_{21} \times \alpha \times QMCCoeffI[0] + Rtmp_{22} \times QMCCoeffI[1]}{NormR};$$

$$QMCCoeffQ[1] = \frac{Rtmp_{22} \times QMCCoeffQ[1]}{NormR};$$

where $\alpha$ is an adjustment parameter, and $0<\alpha\leq 1$ is satisfied.

Meanings of variables in the above updating equations are as follows.

QMCCoeffI[0]: $R_{11}$
QMCCoeffI[1]: $R_{21}$
QMCCoeffQ[1]: $R_{22}$

In the prediction value calculation process of step S5-3, in order to calculate the first compensation coefficient, a calculation for predicting prediction values $P_I[n]$ and $P_Q[n]$ of the output of the amplifier 2 (second half of the prediction value calculation) is performed.

Here, $R_{tmp21}$, $R_{tmp22}$, and $R_I$ obtained in step S5-1 are added to the temporary prediction values obtained in step S4-3 to obtain final prediction values $P_I[n]$ and $P_Q[n]$. Equations for this purpose are shown below.

Norm_R is also a variable for normalization, like NormR. In the following equations, the final prediction values $P_I[n]$ and $P_Q[n]$ are obtained based on the normalized $R_{tmp21}$, $R_{tmp22}$, and $R_I$.

$$\text{Norm\_R} = R_I \times Rtmp_{22};$$

[Equation 15]

$$R_I = \frac{R_I}{\text{Norm\_R}};$$

$$Rtmp_{21} = \frac{Rtmp_{21}}{\text{Norm\_R}};\ Rtmp_{22} = \frac{Rtmp_{22}}{\text{Norm\_R}};$$

$$\begin{aligned}
&\text{for }(n = 0;\ n < \text{DATALEN};\ n++)\\
&\quad P\_re[n] = R_I \times P\_re[n];\\
&\quad P\_im[n] = -Rtmp_{21} \times P\_re[n] + Rtmp_{22} \times P\_im[n];\\
&\text{end}
\end{aligned}$$

Subsequently, the inverse distortion characteristic estimation section 4*b* estimates the first compensation coefficients by using the prediction values $P_I[n]$ and $P_Q[n]$ obtained in step S5-3 (step S6). In the inverse distortion characteristic estimation section 4*b*, the first compensation coefficients are calculated by using not the actual outputs $y_I[n]$ and $y_Q[n]$ of the amplifier 2 but the prediction values $P_I[n]$ and $P_Q[n]$ of the amplifier output after updating of the second compensation coefficient.

Thereby, the first compensation coefficients estimated by the inverse distortion characteristic estimation section 4*b* becomes an appropriate value after updating of the second compensation coefficient.

The first compensation coefficients calculated in step S6 and the second compensation coefficients $R_{11}$, $R_{12}$, $R_{21}$, $R_{22}$, dcOffsetRe, and dcOffsetIm updated in steps S4-2 and S5-2 are transferred to the distortion compensation processing section 4*a* and the IQ offset/imbalance compensation processing section 9*a*, respectively, at approximately the same time (steps S7, S8). Thereby, the first compensation coefficients and the second compensation coefficients start to be used for compensation in the distortion compensation processing section 4a and the IQ offset/imbalance compensation processing section 9a, respectively, at approximately the same time. By starting to use the new first compensation coefficients and the new second compensation coefficients at approximately the same time, mixture of old and new compensation coefficients is avoided, thereby realizing appropriate compensation. Although in FIG. 9 steps S7 and S8 are performed in order, these steps are performed continuously, and therefore, may be regarded as being performed at substantially the same time.

Further, the updated second compensation coefficients are stored in the IQ offset/imbalance compensation coefficients storage section 9b.

Figure 10:
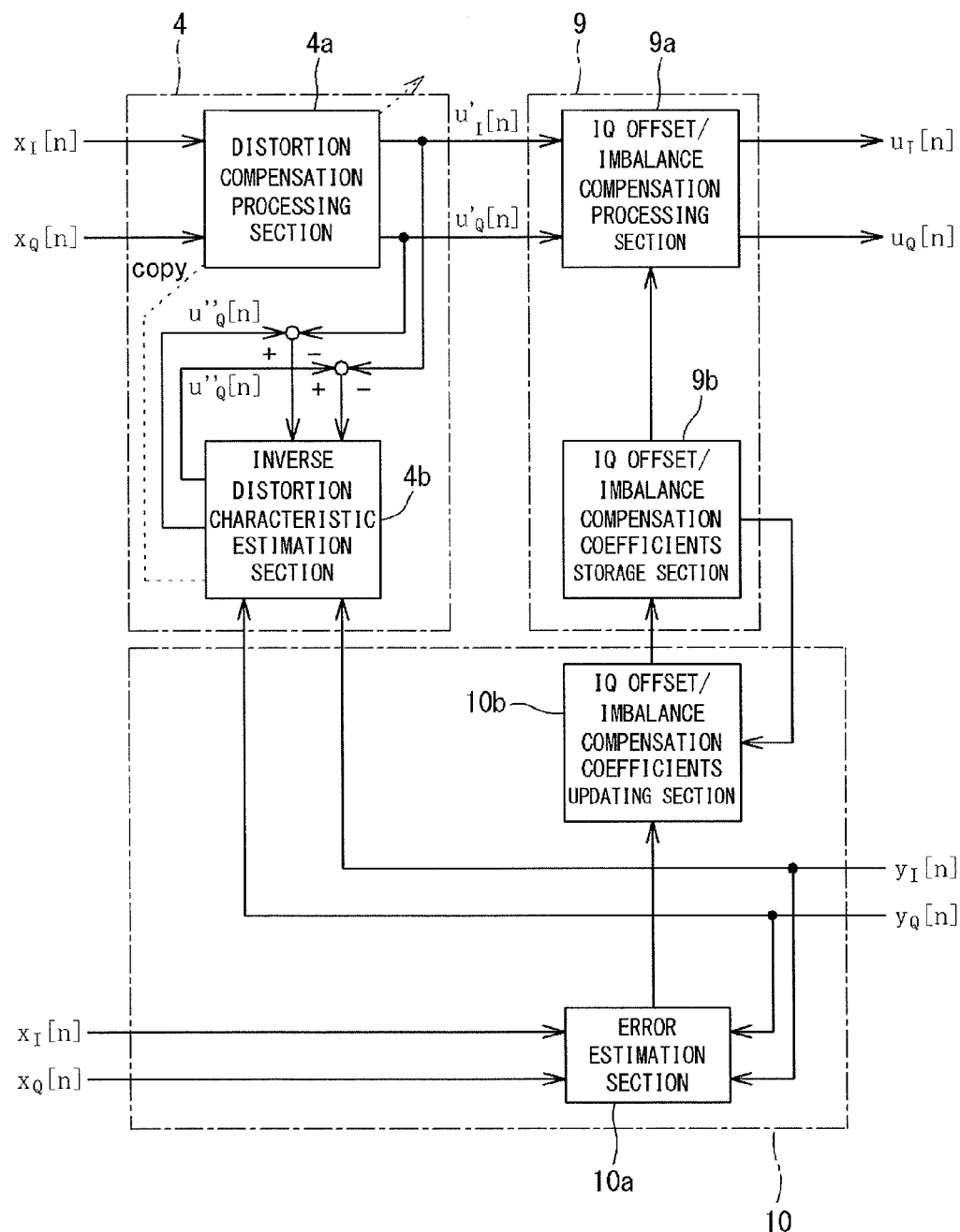
FIG. 10 is a block diagram showing a distortion compensation section, an IQ offset/imbalance compensation section, and a calculation section according to a comparison example.

FIG. 10 is a block diagram showing a case where the prediction section 10c is not provided in FIG. 2. In the case of FIG. 10, the inverse distortion characteristic estimation section 4b calculates the first compensation coefficients by using the outputs $y_I[n]$ and $y_Q[n]$ of the amplifier 2.

Although the distortion compensation section 4 mainly serves as a distortion compensator for the amplifier 2, the distortion compensation section 4 compensates the nonlinear characteristics of all the circuit elements provided at the stages subsequent to the distortion compensation section 4 (toward the amplifier 2) in terms of its principle. In the amplifier circuit 1 of the present embodiment, the IQ offset/imbalance compensation section 9 is provided at the stage subsequent to the distortion compensation section 4. Therefore, variations in the second compensation coefficients used by the IQ offset/imbalance compensation section 9 greatly influence the appropriateness of compensation in the distortion compensation section 4.

Since the outputs $y_I[n]$ and $y_Q[n]$ of the amplifier 2 are not yet subjected to updating of the second compensation coefficients, if the inverse distortion characteristic estimation section 4b calculates the first compensation coefficients by using the outputs $y_I[n]$ and $y_Q[n]$ of the amplifier 2 as shown in FIG. 10, the first compensation coefficients compensates the "nonlinear characteristics of the circuit elements at the stages subsequent to the distortion compensation section 4" at the time "before" updating of the second compensation coefficients.

However, since the first compensation coefficients and the second compensation coefficients start to be used at approximately the same time, when the first compensation coefficients is used, it is necessary to compensate the "nonlinear characteristics of the circuit elements at the stages subsequent to the distortion compensation section 4" at the time "after" updating of the second compensation coefficients.

As described above, in the case of FIG. 10, since the nonlinear characteristics to be compensated by the distortion compensation section 4 are different from the actual nonlinear characteristics, even if estimation of the first compensation coefficients is repeated, it is very difficult to cause the first compensation coefficients to converge, which may rather result in deterioration of the compensation performance.

In contrast to above, as shown in FIG. 2, when the distortion characteristic estimation section 4b estimates the first compensation coefficients by using the prediction values $P_I[n]$ and $P_Q[n]$ of the amplifier output after updating of the second compensation coefficients, the nonlinear characteristics to be compensated by the distortion compensation section 4 are substantially the same as the actual nonlinear characteristics, and therefore, the distortion compensation processing section 4 can efficiently perform appropriate compensation.

The error estimation section 10a calculates an error by using the outputs $y_I[n]$ and $y_Q[n]$ of the amplifier 2 before updating of the first compensation coefficient, and the IQ offset/imbalance compensation coefficients updating section 10b updates the second compensation coefficients by using the error. However, in terms of the principles of the error estimation and the second compensation coefficients updating, presence of nonlinear distortion does not influence the calculations for the error estimation and the second compensation coefficients updating, and therefore, causes no problem.

By the way, when comparing a distortion caused by the nonlinear characteristics of the amplifier 2 and a distortion of a signal caused by a quadrature modulation error (IQ offset/imbalance) in the quadrature modulator 33, the former is larger than the latter. Accordingly, in the initial stage of the repetition of the calculation shown in FIG. 9, the quadrature modulation error distortion in the quadrature modulator 33 is masked by the nonlinear distortion of the amplifier 2, in the amplifier output.

Accordingly, even if updating of the second compensation coefficients is performed by the calculation shown in FIG. 9, the coefficients are hardly updated from the initial values (errors are substantially zero), and therefore, the state where only the first compensation coefficients are updated continues.

As the first compensation coefficients gradually converges to the optimum value, the nonlinear distortion of the amplifier 2 is reduced, and the quadrature modulation error distortion that has been masked starts to be observed in the amplifier output (refer to FIG. 5). Thereby, the quadrature modulation error distortion is compensated.

As described above, in the amplifier circuit 1 of the present embodiment, one of the quadrature modulation error distortion and the nonlinear distortion of the amplifier 2, which is larger than the other, is compensated, and both the distortions are little by little compensated by the repetitive calculations for compensation.

[4. Appended Notes]

The embodiment described above is to be considered in all respects as illustrative and not restrictive. The scope of the present invention is indicated by the appended claims rather than by the foregoing meaning, and all changes which come within the meaning and range of equivalency of the claims are therefore intended to be embraced therein.

DESCRIPTION OF THE REFERENCE CHARACTERS 1 amplifier circuit
2 amplifier
2a signal input port
2b signal output port
2c power supply port
3 variable power supply
4 distortion compensation section
4a compensation processing section
4b inverse distortion characteristic estimation section
5 power detection section
6 power-to-voltage conversion section
9 IQ offset/imbalance compensation section (quadrature modulation error compensation section)
9a IQ offset/imbalance compensation processing section (quadrature modulation error compensation processing section)

9b IQ offset/imbalance compensation coefficients storage section (quadrature modulation error compensation coefficients storage section)
10 calculation section
10a error estimation section
10b IQ offset/imbalance compensation coefficients updating section (quadrature modulation error compensation coefficients updating section)
10c prediction section
31a, 31b timing adjustment section
33 quadrature modulator
34 frequency conversion section
35a, 35b driver amplifier
36 coupler
37 variable attenuator
38 frequency conversion section
39 filter
41 signal processing section
200 ET amplifier

The invention claimed is:

1. An amplifier circuit, comprising:
a quadrature modulator that quadrature-modulates an IQ baseband signal;
an amplifier that amplifies the quadrature-modulated signal;
a distortion compensation section that compensates for distortion to be caused in the amplifier based on first compensation coefficients;
a quadrature modulation error compensation section that compensates the IQ baseband signal outputted from the distortion compensation section for a quadrature modulation error;
an updating section that updates second compensation coefficients that are used for compensation in the quadrature modulation error compensation section;
an error estimation section that estimates an error, which is caused by that the IQ baseband signal outputted from the quadrature modulation error compensation section is quadrature-modulated by the quadrature modulator; and
a prediction section that calculates a prediction value of an output of the amplifier after updating of the second compensation coefficients, wherein
the updating section updates the second compensation coefficients, based on the error estimated by the estimation section,
the error estimation section estimates the error, based on the IQ baseband signal before compensated by the distortion compensation section, and the IQ baseband signal obtained by quadrature demodulation of the output of the amplifier,
the prediction section calculates the prediction value, based on the error estimated by the estimation section, and the IQ baseband signal obtained by quadrature demodulation of the output of the amplifier before updating of the second compensation coefficients based on the error estimated by the estimation section, and
the distortion compensation section calculates the first compensation coefficient, based on the prediction value.

2. The amplifier circuit according to claim 1, wherein
the error estimation section estimates the error which is caused by that the IQ baseband signal outputted from the quadrature modulation error compensation section is DA-converted and quadrature-modulated by the quadrature modulator.

3. The amplifier circuit according to claim 1, wherein
the error estimated by the error estimation section includes:
a DC offset and/or a carrier wave leakage which occur in a path from a DA converter that performs DA conversion of the IQ baseband signal outputted from the quadrature modulation error compensation section, to the quadrature modulator; and
an IQ gain imbalance and/or a quadrature deviation which occur in the path from the DA converter that performs DA conversion of the IQ baseband signal outputted from the quadrature modulation error compensation section, to the quadrature modulator.

4. Wireless communication equipment including the amplifier circuit according to claim 1.

5. A method for compensating a signal by using an amplifier circuit,
the amplifier circuit comprising:
a quadrature modulator that quadrature-modulates an IQ baseband signal;
an amplifier that amplifies the quadrature-modulated signal;
a distortion compensation section that compensates for distortion to be caused in the amplifier based on first compensation coefficients; and
a quadrature modulation error compensation section that compensates the IQ baseband signal outputted from the distortion compensation section for a quadrature modulation error, and
the method comprising the steps of:
estimating an error, which is caused by that the IQ baseband signal outputted from the quadrature modulation error compensation section is quadrature-modulated by the quadrature modulator, based on the IQ baseband signal before compensated by the distortion compensation section, and the IQ baseband signal obtained by quadrature demodulation of the output of the amplifier;
updating, based on the error estimated in the step of estimating, second compensation coefficients that are used for compensation in the quadrature modulation error compensation section;
calculating a prediction value of the output of the amplifier after updating of the second compensation coefficients, based on the error estimated in the step of estimating, and the IQ baseband signal obtained by quadrature demodulation of the output of the amplifier before updating of the second compensation coefficients based on the error estimated in the step of estimating; and
calculating the first compensation coefficients based on the prediction value.

6. The method according to claim 5, wherein
the calculated new first compensation coefficients and the updated new second compensation coefficients start to be used by the distortion compensation section and the quadrature modulation error compensation section, respectively, at approximately the same time.

* * * * *